(12) United States Patent
Ker et al.

(10) Patent No.: US 8,952,456 B2
(45) Date of Patent: Feb. 10, 2015

(54) ELECTROSTATIC DISCHARGE CIRCUIT USING INDUCTOR-TRIGGERED SILICON-CONTROLLED RECTIFIER

(75) Inventors: Ming-Do Ker, Zhubei (TW); Chun-Yu Lin, Hualien (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1330 days.

(21) Appl. No.: 12/711,302

(22) Filed: Feb. 24, 2010

(65) Prior Publication Data

US 2011/0207409 A1    Aug. 25, 2011

(51) Int. Cl.
*H01L 23/62*   (2006.01)
*H01L 27/02*   (2006.01)

(52) U.S. Cl.
CPC .................................. *H01L 27/0262* (2013.01)
USPC ............ 257/355; 257/133; 257/139; 257/173; 361/91.5; 438/133

(58) Field of Classification Search
USPC .................................. 257/170, 355; 361/91.5
See application file for complete search history.

(56) References Cited

U.S. PATENT DOCUMENTS 5,546,038 A * 8/1996 Croft .............................. 327/310
6,806,160 B2 * 10/2004 Ker et al. ...................... 438/371

* cited by examiner

*Primary Examiner* — Cheung Lee
*Assistant Examiner* — Stephen Bradley
(74) *Attorney, Agent, or Firm* — Duane Morris LLP (57) ABSTRACT

A representative electrostatic discharge (ESD) protection circuit includes a silicon-controlled rectifier comprising an alternating arrangement of a first P-type semiconductor material, a first N-type semiconductor material, a second P-type semiconductor material and a second N-type semiconductor material electrically coupled between an anode and a cathode. The anode is electrically coupled to the first P-type semiconductor material and the cathode is electrically coupled to the second N-type semiconductor material. The ESD protection circuit further includes an inductor electrically coupled between the anode and the second P-type semiconductor material or between the cathode and the first N-type semiconductor material.

20 Claims, 12 Drawing Sheets

ELECTROSTATIC DISCHARGE CIRCUIT USING INDUCTOR-TRIGGERED SILICON-CONTROLLED RECTIFIER

TECHNICAL FIELD

The present disclosure is generally related to electrical circuits, and more particularly to electrostatic discharge protection circuits.

BACKGROUND

A radio frequency (RF) receiver connected to an antenna is susceptible to damaging electrostatic discharge (ESD) pulses from its operating environment. As integrated circuits, including RF receivers, shrink in physical size, the integrated circuits are becoming more susceptible to ESD because of its smaller fabrication geometry. There are various traditional methods of shunting ESD to protect integrated circuits including using complementary metal oxide semiconductor (CMOS) or bipolar clamp diodes. However, when operating at high frequency, such as five (5) GHz, the parasitic impedance of traditional ESD protection circuits can distort and deteriorate signal integrity.

Desirable in the art is an improved ESD protection circuit.

SUMMARY

A representative electrostatic discharge (ESD) protection circuit includes a silicon-controlled rectifier comprising an alternating arrangement of a first P-type semiconductor material, a first N-type semiconductor material, a second P-type semiconductor material and a second N-type semiconductor material electrically coupled between an anode and a cathode. The anode is electrically coupled to the first P-type semiconductor material and the cathode is electrically coupled to the second N-type semiconductor material. The ESD protection circuit further includes an inductor electrically coupled between the anode and the second P-type semiconductor material or between the cathode and the first N-type semiconductor material.

The above and other features of the present invention will be better understood from the following detailed description of the exemplary embodiments of the invention that is provided in connection with the accompanying drawings.

BRIEF DESCRIPTION OF DRAWINGS

The accompanying drawings illustrate exemplary embodiments of the invention, as well as other information pertinent to the disclosure, in which.

DETAILED DESCRIPTION

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning electrical communications and the like, such as, "coupled" and "electrically coupled" or "electrically connected," refer to a relationship wherein nodes communicate with one another either directly or indirectly through intervening structures, unless described otherwise.

Figure 1:
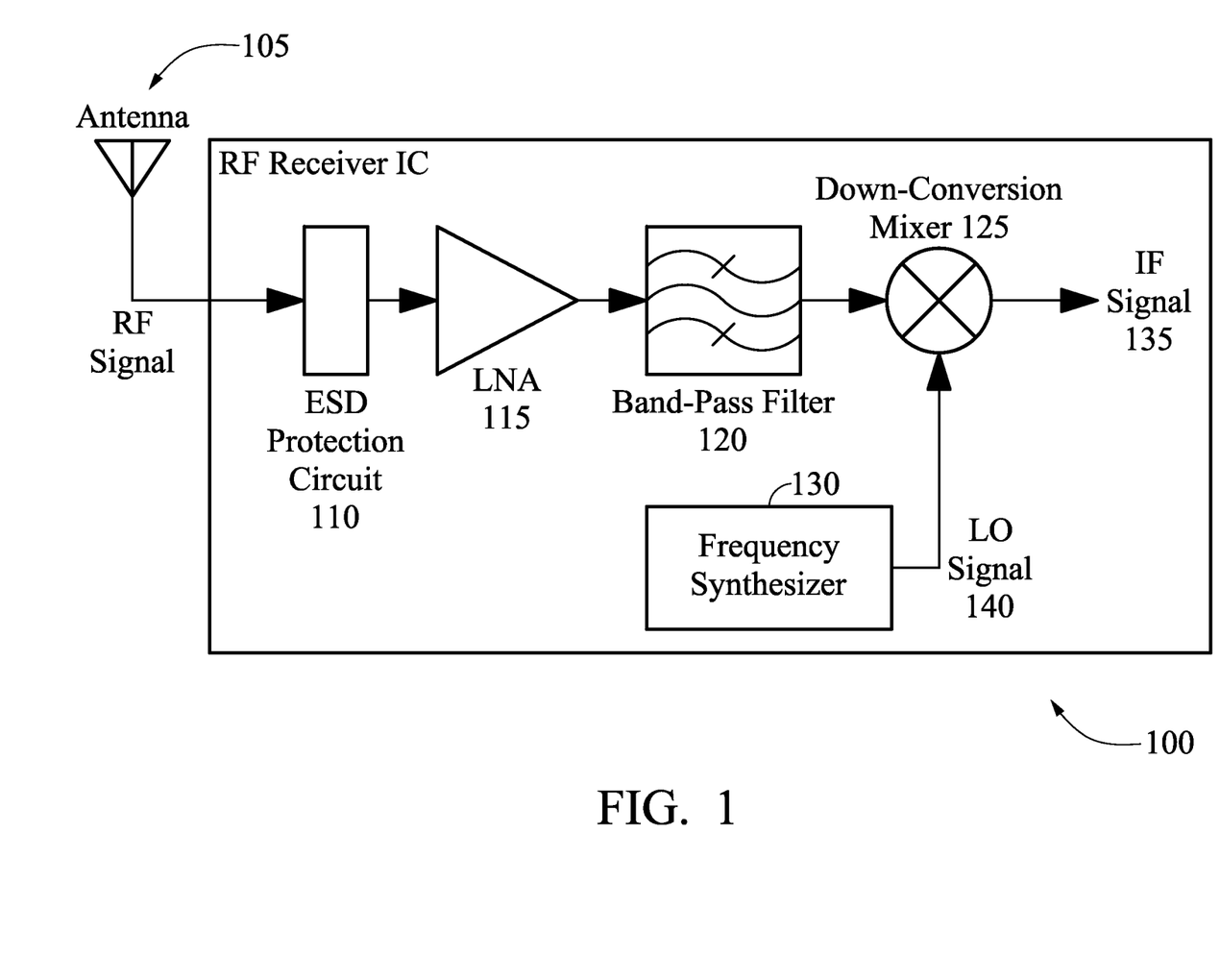
FIG. 1 is a block diagram that illustrates a radio frequency receiver having an electrostatic discharge protection circuit in accordance with an embodiment of the disclosure.

FIG. 1 is a block diagram that illustrates a radio frequency (RF) receiver 100 having an electrostatic discharge (ESD) protection circuit 110 in accordance with an embodiment of the disclosure. The RF receiver 100 includes an antenna 105 that receives RF signals and sends the RF signals to an ESD protection circuit 110. In general, the ESD protection circuit 110 diverts electrostatic discharge received by the RF receiver 100 away from other components of the RF receiver 100. The ESD protection circuit 110 is further described in FIGS. 2-6.

The ESD protection circuit 110 passes the RF signals to a low noise amplifier 115 which amplifies and sends the amplified RF signals to a band pass filter 120. The band pass filter 120 filters the amplified RF signals and sends the filtered RF signals to a mixer 125. The mixer 125 mixes the filtered RF signals with local oscillator signals 140 from a frequency synthesizer 130. The mixer 125 produces an intermediate frequency (IF) signal 135, which is processed by other components (not shown) of the RF receiver 100 familiar to the person of ordinary skill in the art.

Figure 2:
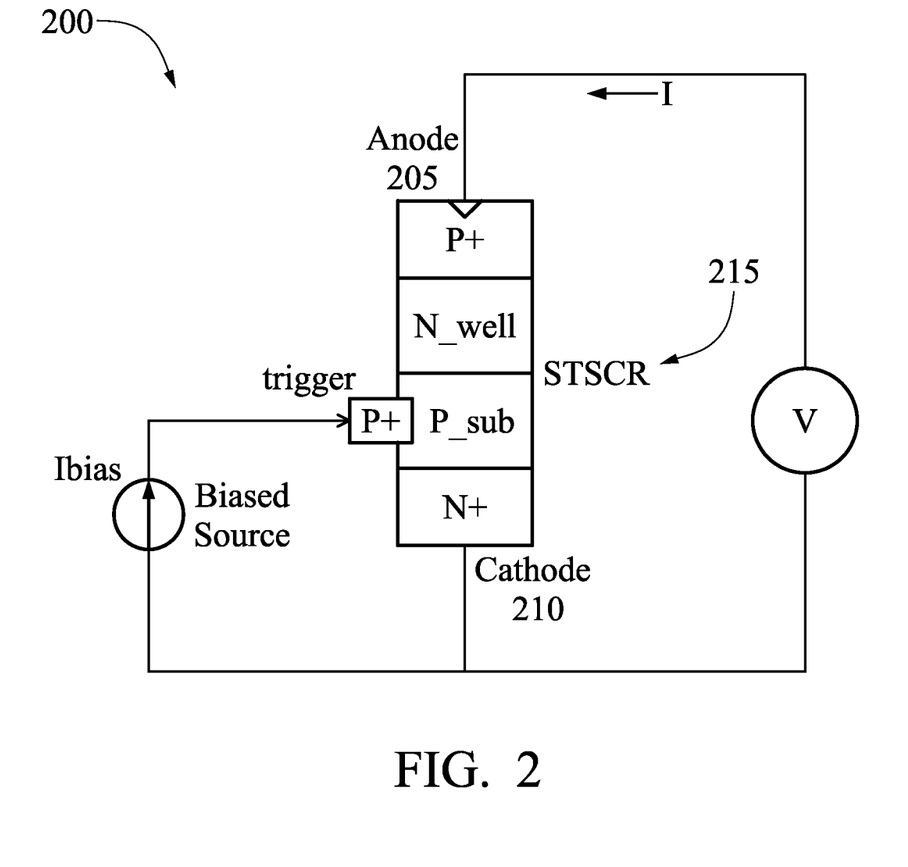
FIG. 2 illustrates a silicon-controlled rectifier in accordance with an embodiment of the disclosure.

FIG. 2 is a diagram of an embodiment of a silicon-controlled rectifier 200 that can be implemented in the ESD protection circuit 110. The silicon-controlled rectifier 200 includes multiple layers 215 of P and N type semiconductor materials, e.g., PNPN four layer pellets. An anode 205 is electrically coupled to a P+ semiconductor material, which is one of the P type semiconductor materials of the multiple layers 215. A cathode 210 is electrically coupled to an N+ semiconductor material, which is one of the N type semiconductor materials of the multiple layers 215. By applying current from the biased source to the P+ semiconductor material on a P substrate (labeled P_sub) of the silicon-controlled rectifier 200, current received at the anode 205 is conducted across the silicon-controlled rectifier 200 to the cathode 210. This method of securing the silicon-controlled rectifier conduction is called "triggering."

Figure 3:
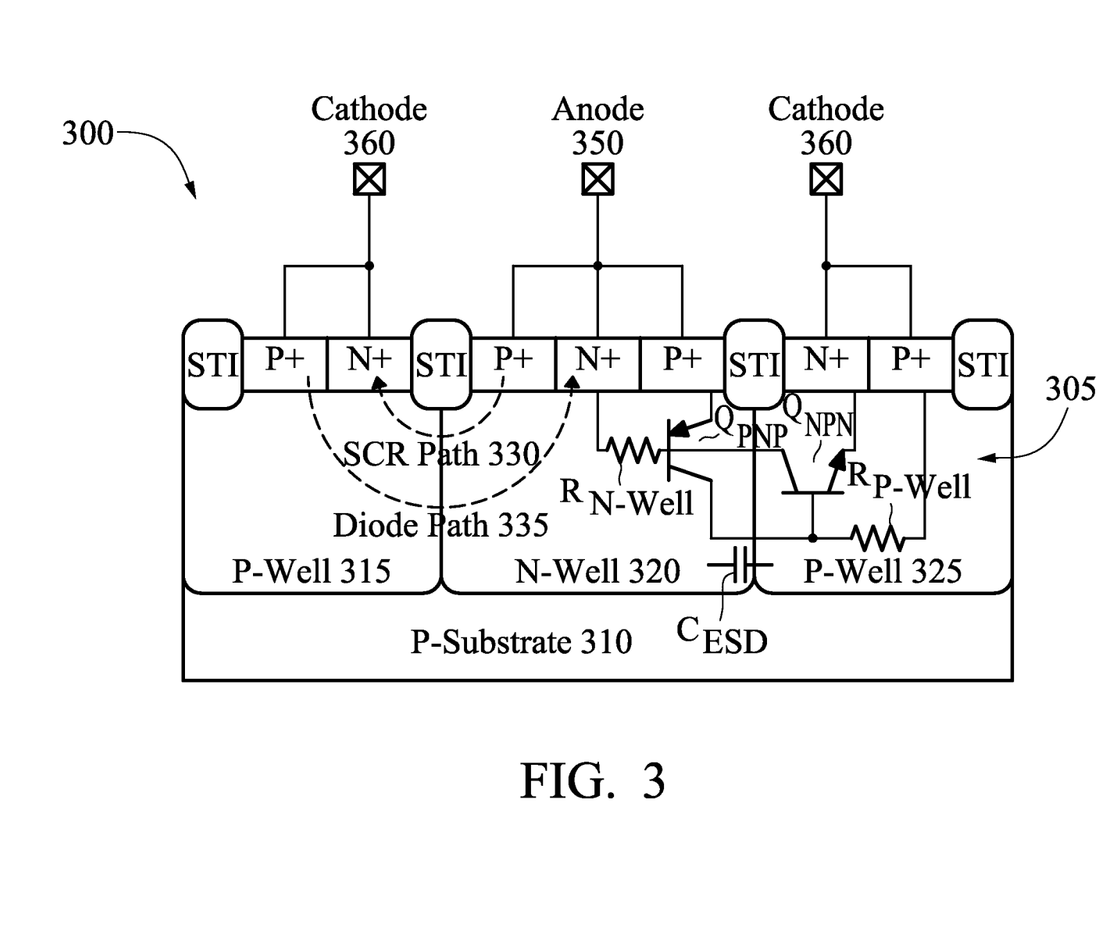
FIG. 3 is a view that illustrates a structure of two silicon-controlled rectifiers in accordance with an embodiment of the disclosure.

FIG. 3 illustrates an embodiment of the structure of two silicon-controlled rectifiers 300 having an anode 350 and two cathodes 360. In this example, the two silicon-controlled rectifiers 300 are in parallel and include a P substrate 310 having well regions 315, 320, 325 formed in the P substrate 310. The well regions 315, 320, 325 have implanted alternating P+ and N+ regions and shallow trench isolations (STIs) separating them. The anode 350 is coupled to the P+, N+, and P+ semiconductor materials that are implanted in an N-well 320 and the cathodes 360 are connected to the P+ and N+ semiconductor materials that are implanted in the P-wells 315, 325. The view of the structure also includes a circuit diagram 305 of the silicon-controlled rectifiers 300. In general, the silicon-controlled rectifiers 300 conduct current from the anode 350 to the cathode 360 by way of an SCR path 330 responsive to detecting electrostatic discharge. The silicon-controlled rectifiers 300 can be designed such the electrostatic discharge at a certain level can trigger the silicon-controlled rectifiers 300 such that current is conducted from the anode 350 to cathode 360 diverting the electrostatic discharge away from other electrical components. If negative electrostatic discharge is detected, the silicon-controlled rectifiers 300 conduct current from the cathode 360 to the anode 350 by way of a diode path 335.

Figure 4:
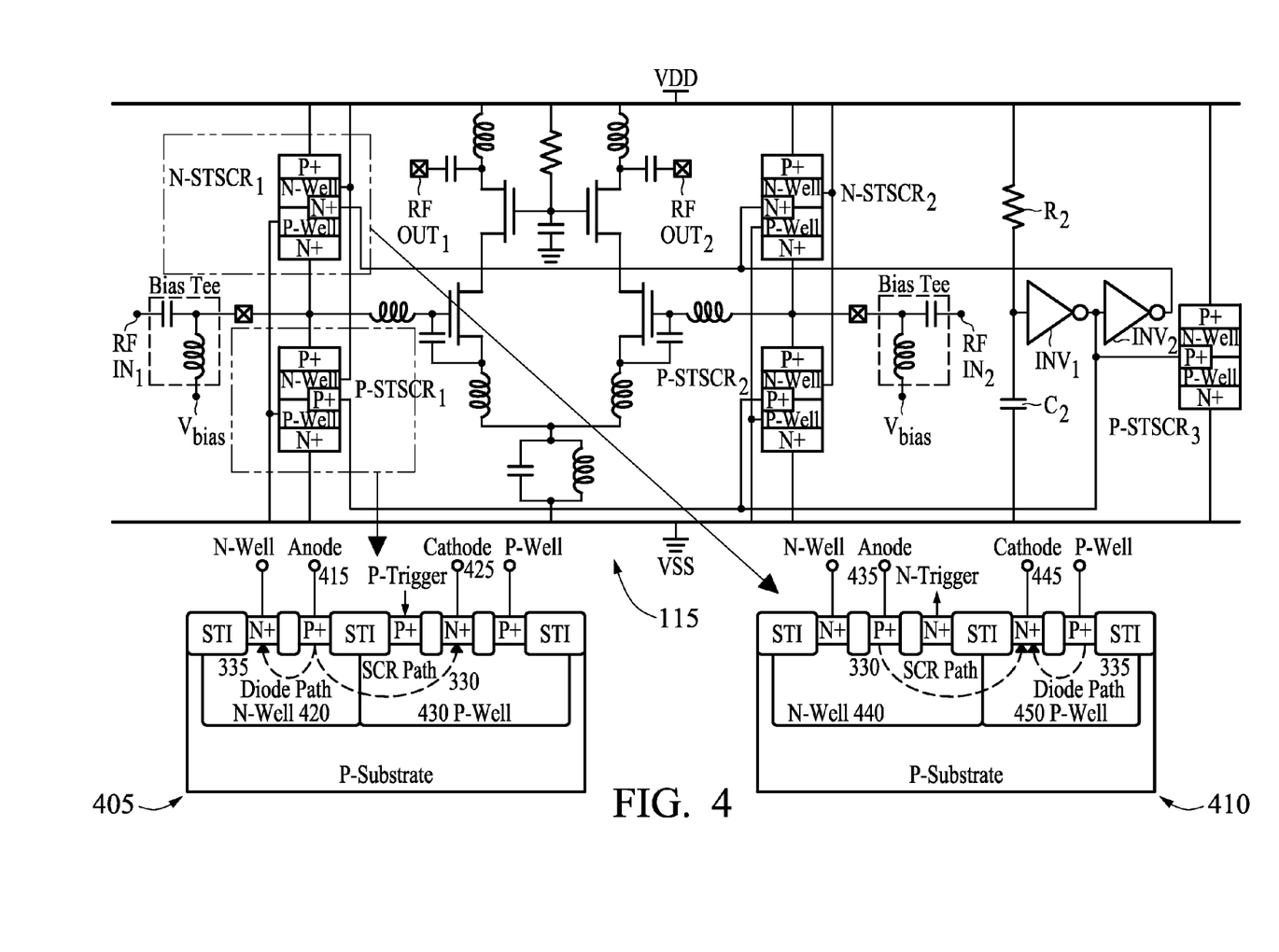
FIG. 4 is a circuit diagram that illustrates a low noise amplifier coupled to a silicon-controlled rectifier (SCR) electrostatic discharge (ESD) device in accordance with an embodiment of the disclosure.

FIG. 4 shows silicon-controlled rectifiers 405, 410 that are electrically coupled to a low noise amplifier 115 and further illustrating the diode path 335 and SCR paths 330. The structures of the silicon-controlled rectifiers 405, 410 are shown below the circuit diagram. In this example, the silicon-controlled rectifier 405 includes an anode 415 coupled to the P+ semiconductor material that is implanted in an N-well 420 and the cathode 425 is connected to the N+ semiconductor material that is implanted in the P-well 430. The silicon-controlled rectifier 410 includes an anode 435 coupled to the P+ semiconductor material that is implanted in an N-well 440 and the cathode 445 is connected to the N+ semiconductor material that is implanted in the P-well 450. The silicon-controlled rectifier 405 is triggered at a P type semiconductor material implanted in P well 430 and the silicon-controlled rectifier 410 is triggered at an N type semiconductor materials implanted in N well 440. However, the silicon-controlled rectifiers 405, 410 have parasitic capacitance that can affect the performance of the low noise amplifier 115. The silicon-controlled rectifiers 405, 410 can be coupled with inductors 505A-D to compensate for the parasitic capacitance, which is further described in connection with FIGS. 5A-D and 6A-D.

Figure 5A:
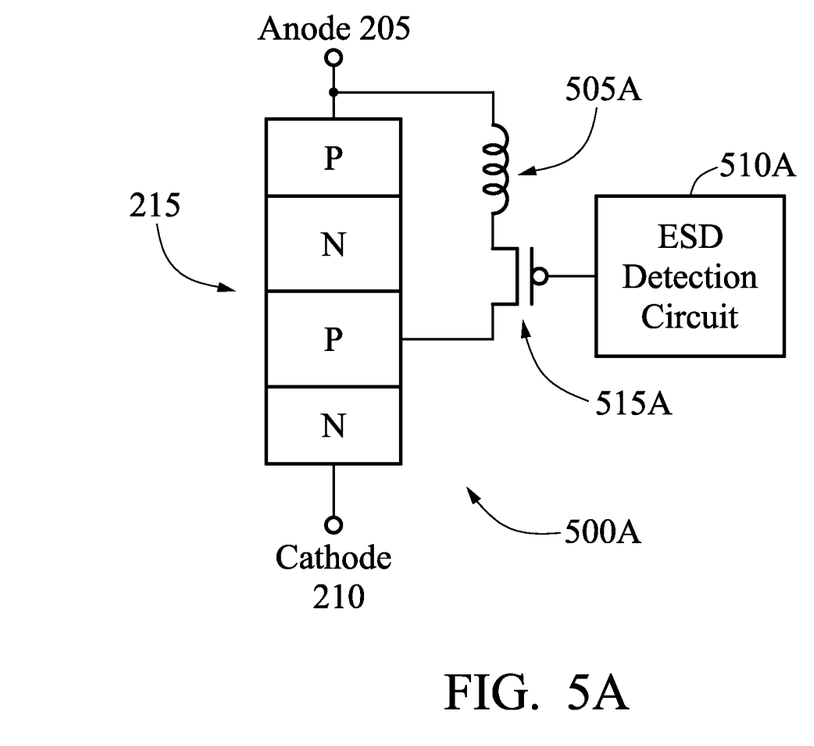
FIGS. 5A-D are views that illustrate silicon-controlled rectifiers that are coupled to electrostatic discharge detection circuits in accordance with an embodiment of the disclosure.
Figure 5B:
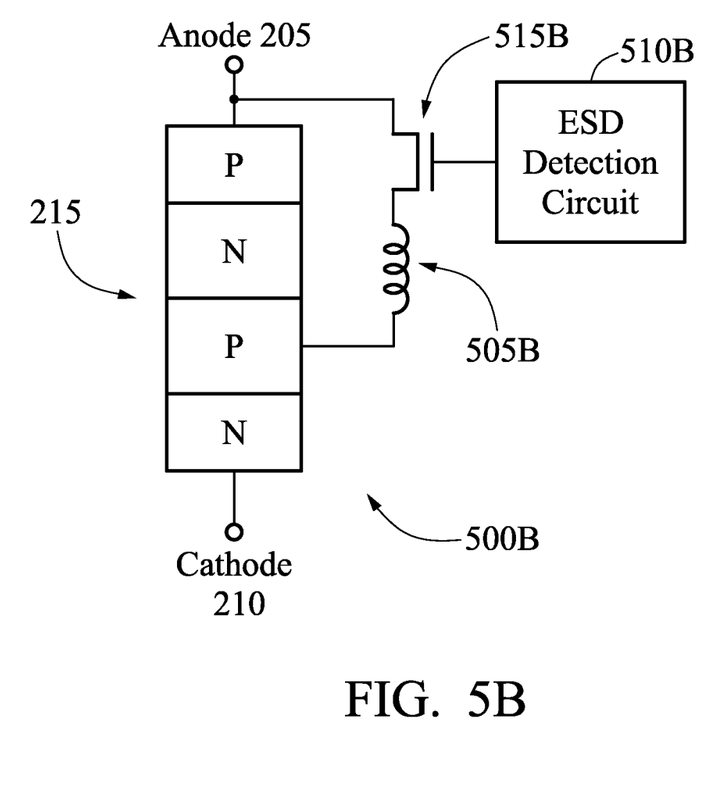

FIGS. 5A-D illustrate various embodiments of the silicon-controlled rectifiers 500A-B that are coupled to an inductor 505 and a transistor 515, which is coupled to an electrostatic discharge detection circuits 510. Referring to FIGS. 5A-5B, the silicon-controlled rectifiers 500A-B include multiple layers 215 of P and N type semiconductors. The anode 205 is electrically coupled to a top P type semiconductor materials of the multiple layers 215. The cathode 210 is electrically coupled to a bottom N type semiconductor materials of the multiple layers 215. Inductors 505A, 505B are electrically coupled between the anode 205 and a P type semiconductor material that is positioned between the N type semiconductor materials of the multiple layers 215. ESD detection circuits 510A, 510B can be coupled to the inductors 505A, 505B by way of a PMOS transistor 515A or NMOS transistor 515B, such as that shown in FIGS. 5A and 5B, respectively.

Responsive to the presence of an electrostatic discharge at the anode 205, the silicon-controlled rectifiers 500A-B are triggered and the electrostatic discharge is conducted through the silicon-controlled rectifiers 500A-B and through the inductors 505A-B and the ESD detection circuits 510A, 510B. The inductors 505A-B are used to compensate for the parasitic capacitance of the silicon-controlled rectifiers 500A-B in the RF bands. The inductors 505A-B can also provide a conductive path to trigger the silicon-controlled rectifiers 500A-B.

Figure 5C:
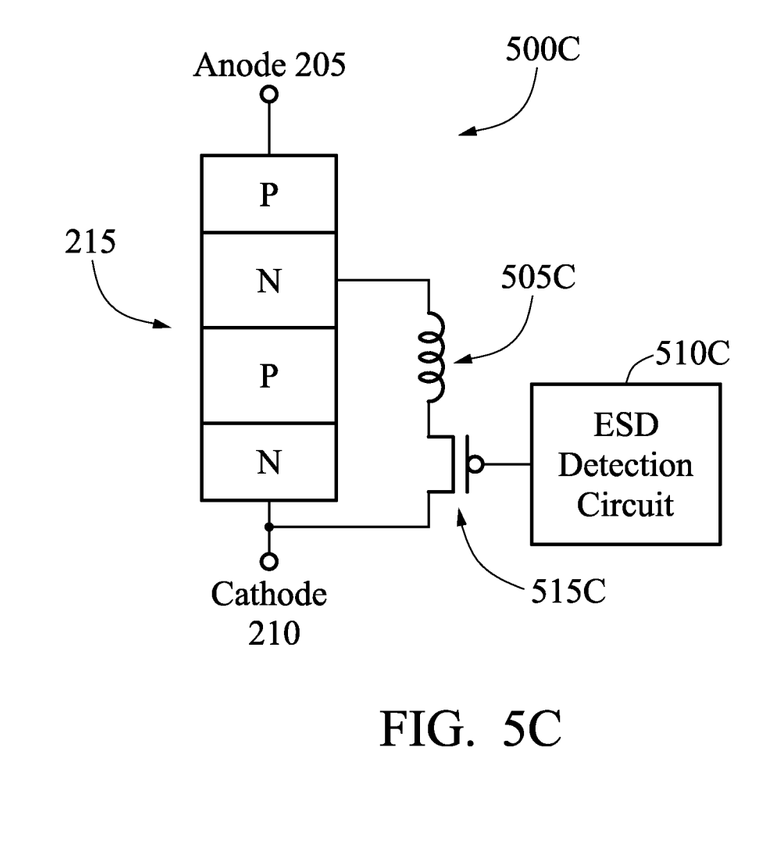
Figure 5D:
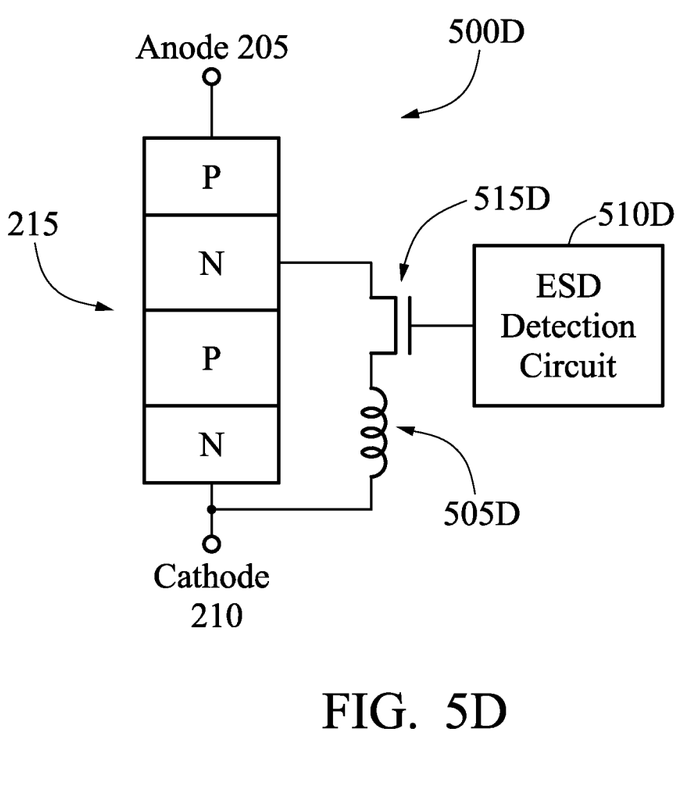
Figure 6A:
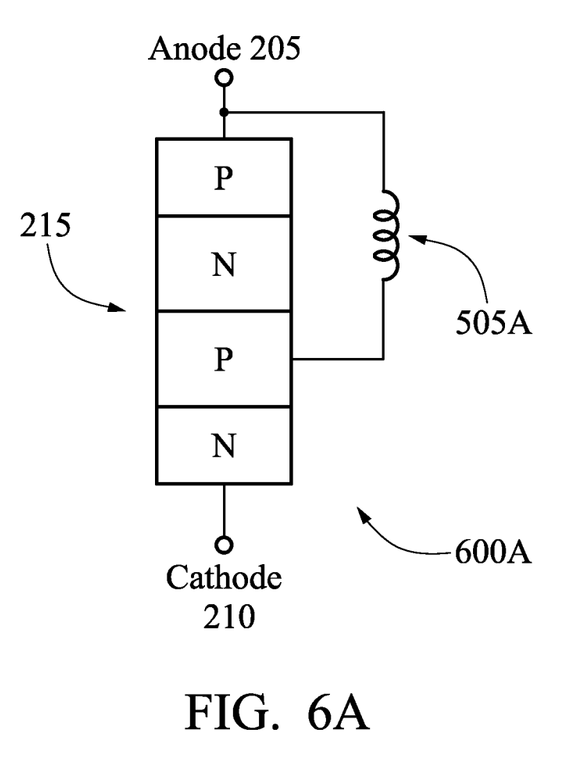
FIGS. 6A-D are views illustrating silicon-controlled rectifiers having an inductor in accordance with an embodiment of the disclosure.
Figure 6B:
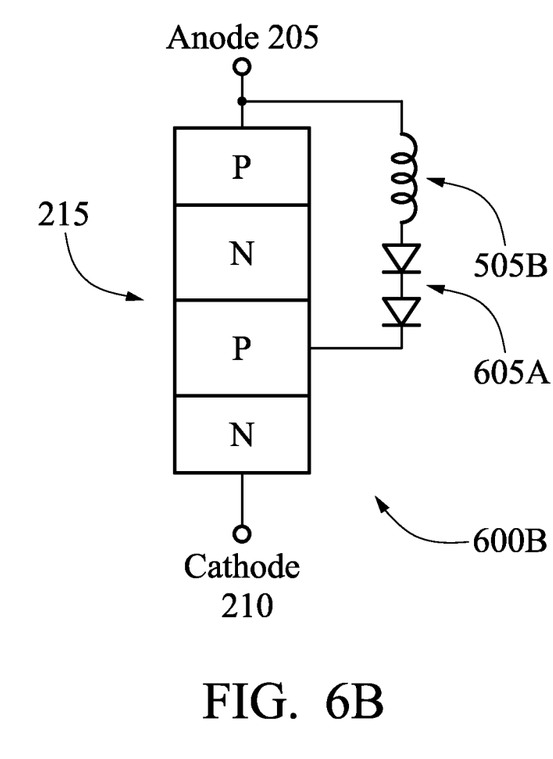
Figure 6C:
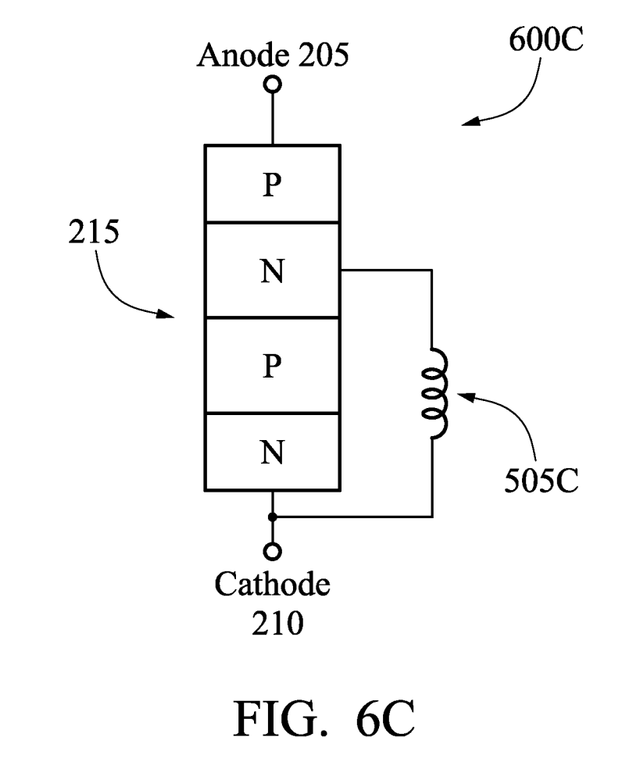
Figure 6D:
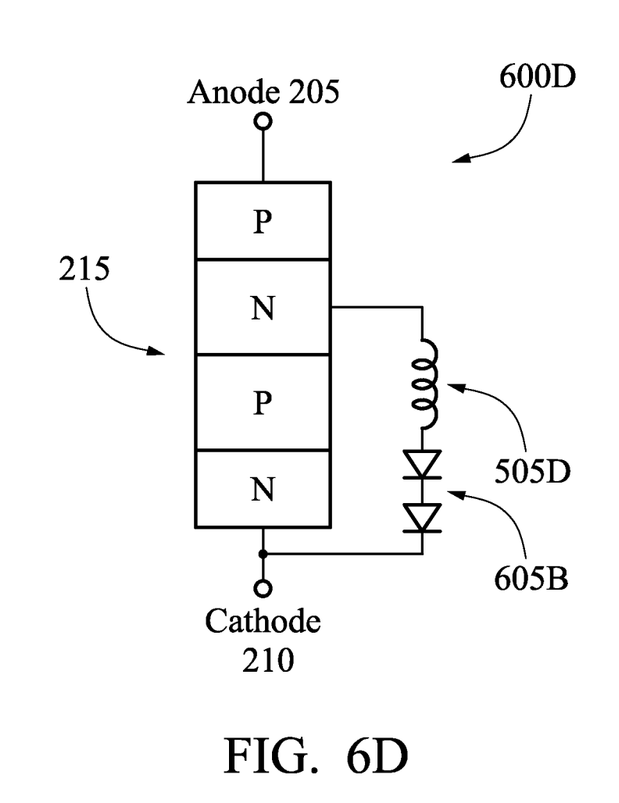

Referring to FIGS. 5C and 5D, the silicon-controlled rectifiers 500C-D include inductors 505C, 505D that are electrically coupled between the cathode 210 and an N type semiconductor that is positioned between the P type semiconductor materials of the multiple layers 215. ESD detection circuits 510C, 510D are coupled to the inductors 505C, 505D by way of a PMOS transistor 515C or an NMOS transistor 515D, such as that shown in FIGS. 5C and 5D, respectively. Alternatively or additionally, the PMOS transistor 515C can be arranged above the inductor 505C or the NMOS transistor 515D can be arranged below the inductor 505D.

Responsive to the presence of an electrostatic discharge at the cathode 210, the silicon-controlled rectifiers 500C-D is triggered and the electrostatic discharge is conducted through the silicon-controlled rectifiers 500C-D and through the inductors 505C-D and the ESD detection circuits 510D, 510D. Similarly as with the inductors 505A-B in FIGS. 5A-B, the inductors 505C-D are used to compensate for the parasitic capacitance of the silicon-controlled rectifiers 500C-D in the RF bands. It should be noted that the inductors 505A-D in FIGS. 5A-D triggers the silicon-controlled rectifiers 500A-D, which prevent the low noise amplifier 115 from breakdown by clamping the positive or negative ESD pulses to ground.

FIGS. 6A-D illustrate embodiments of the silicon-controlled rectifiers 600A-D having only an inductor 505 or an inductor coupled with diodes 605A-B in series. The circuits shown in FIGS. 6A-D present the other possible connections of the silicon-controlled rectifiers 600A-D with inductors 505A-D than that shown in FIGS. 5A-D. The operation of the circuits in FIGS. 6A-D is similar to the circuits in FIGS. 5A-D. The silicon-controlled rectifiers 600A-D are triggered by the respective inductors 505A-D under ESD events, and the parasitic capacitance of silicon-controlled rectifiers 600A-D is compensated by the respective inductors 505A-D in RF bands.

This description has been presented for purposes of illustration and description. It is not intended to be exhaustive or to limit the disclosure to the precise forms disclosed. Obvious modifications or variations are possible in light of the above teachings. The embodiments discussed, however, were chosen to illustrate the principles of the disclosure, and its practical application. The disclosure is thus intended to enable one of ordinary skill in the art to use the disclosure, in various embodiments and with various modifications, as are suited to the particular use contemplated. All such modifications and variation are within the scope of this disclosure, as determined by the appended claims when interpreted in accordance with the breadth to which they are fairly and legally entitled.

What is claimed is:

1. An electrostatic discharge (ESD) protection circuit comprising:
   a silicon-controlled rectifier comprising an alternating arrangement of a first P-type semiconductor material, a first N-type semiconductor material, a second P-type semiconductor material and a second N-type semiconductor material electrically coupled between an anode and a cathode, wherein the anode is electrically coupled to the first P-type semiconductor material and the cathode is electrically coupled to the second N-type semiconductor material; and
   an inductor electrically coupled between the anode and the second P-type semiconductor material wherein an electrical path from the anode to the inductor to the second P-type semiconductor material excludes the first and second N-type semiconductor materials or between the cathode and the first N-type semiconductor material wherein the electrical path from the cathode to the inductor to the first N-type semiconductor material excludes the first and second P-type semiconductor materials.

2. The ESD protection circuit of claim 1, further comprising at least one diode electrically coupled in series with the inductor between the anode and the second P-type semiconductor material or between the cathode and the first N-type semiconductor material.

3. The ESD protection circuit of claim 1, further comprising a PMOS transistor electrically coupled in series with the inductor between the anode and the second P-type semiconductor material or between the first N-type semiconductor material and the cathode.

4. The ESD protection circuit of claim 3, further comprising an electrostatic discharge (ESD) detection circuit that is coupled to a gate of the PMOS transistor.

5. The ESD protection circuit of claim 1, further comprising an NMOS transistor electrically coupled in series with the inductor between the anode and the second P-type semiconductor material or between the first N-type semiconductor material and the cathode.

6. The ESD protection circuit of claim 5, further comprising an electrostatic discharge (ESD) detection device that is coupled to a gate of the NMOS transistor.

7. The ESD protection circuit of claim 1, wherein the inductor is electrically coupled between the anode and the second P-type semiconductor material.

8. The ESD protection circuit of claim 1, wherein the inductor is electrically coupled between the cathode and the first N-type semiconductor material.

9. A structure comprising:
an P substrate;
an N-Well and a P-well that is positioned above the P substrate;
a P+ semiconductor material that is positioned in the N-well;
an N+ semiconductor material that is positioned in the P-well;
an alternating arrangement of the P+ semiconductor material, the N-Well, the P-Well and the N+ semiconductor material; and
an inductor electrically coupled between the P+ semiconductor material and the P-Well wherein an electrical path from the anode to the inductor to the second P-type semiconductor material excludes the first and second N-type semiconductor materials or between the N-Well and the N+ semiconductor material wherein the electrical path from the N-Well to the inductor to the N+ semiconductor material excludes the P-Well and the P+ semiconductor material.

10. The structure of claim 9, further comprising at least one diode electrically coupled in series with the inductor between the P+ semiconductor material and the P-Well or between the N-Well and the N+ semiconductor material.

11. The structure of claim 9, further comprising a PMOS transistor electrically coupled in series with the inductor between the P+ semiconductor material and the P-Well or between the N-Well and the N+ semiconductor material.

12. The structure of claim 11, further comprising an electrostatic discharge (ESD) detection circuit that is coupled to a gate of the PMOS transistor.

13. The structure of claim 9, further comprising an NMOS transistor electrically coupled in series with the inductor between the P+ semiconductor material and the P-Well or between the N-Well and the N+ semiconductor material.

14. The structure of claim 13, further comprising an electrostatic discharge (ESD) detection device that is coupled to a gate of the NMOS transistor.

15. The structure of claim 9, wherein the inductor is electrically coupled between the P+ semiconductor material and the P-Well.

16. The structure of claim 9, wherein the inductor is electrically coupled between the N-Well and the N+ semiconductor material.

17. A radio frequency (RF) receiver comprising:
an antenna for reception of RF signals;
an electrostatic discharge (ESD) protection circuit having an input for receiving the RF signals, wherein the ESD protection circuit diverts an electrostatic discharge received by the RF receiver away from other components of the RF receiver, wherein the ESD protection circuit includes:
a silicon-controlled rectifier comprising an alternating arrangement of a first P-type semiconductor material, a first N-type semiconductor material, a second P-type semiconductor material and a second N-type semiconductor material electrically coupled between an anode and a cathode, wherein the anode is electrically coupled to the first P-type semiconductor material and the cathode is electrically coupled to the second N-type semiconductor material; and
an inductor electrically coupled between the anode and the second P-type semiconductor material wherein an electrical path from the anode to the inductor to the second P-type semiconductor material excludes the first and second N-type semiconductor materials or between the cathode and the first N-type semiconductor material wherein the electrical path from the cathode to the inductor to the first N-type semiconductor material excludes the first and second P-type semiconductor materials.

18. The RF receiver of claim 17, wherein the other components of the RF receiver include at least one of the following:
an amplifier that receives and amplifies the RF signals,
a band-pass filter that receives the amplified RF signals, and
a mixer that receives and mixes the filtered RF signals with local oscillator signals, wherein the mixer sends the mixed signals to an intermediate frequency section of the RF receiver.

19. The RF receiver of claim 17, wherein the inductor is electrically coupled between the anode and the second P-type semiconductor material.

20. The RF receiver of claim 17, wherein the inductor is electrically coupled between the cathode and the first N-type semiconductor material.

* * * * *